INVENTOR.
Geza Csanky
BY Mueller & Aichele
ATTY'S.

Sept. 6, 1966 G. CSANKY 3,271,633

INTEGRATED FIELD EFFECT DEVICE WITH SERIES CONNECTED CHANNEL

Filed Jan. 29, 1963 2 Sheets-Sheet 2

INVENTOR.
Geza Csanky

BY

Mueller, Aichele & Rauner

ATTY'S.

3,271,633
Patented Sept. 6, 1966

3,271,633

INTEGRATED FIELD EFFECT DEVICE WITH SERIES CONNECTED CHANNEL

Geza Csanky, Mesa, Ariz., assignor to Motorola, Inc., Chicago, Ill., a corporation of Illinois Filed Jan. 29, 1963, Ser. No. 254,652
6 Claims. (Cl. 317—234)

The present invention relates to solid state devices, and it relates more particularly to a screen electrode transistor assembly which is particularly suited for integrated circuit construction.

The prior art unipolar field effect transistor, first described by Shockley in 1952, does not operate by the process of injection and, therefore, is not a transistor in the normal sense. The term "unipolar" refers to the fact that current is transported in the field effect transistor by "majority" carries of one polarity only; whereas in the usual transistor, "majority" and "minority" carriers of both polarities are involved.

Many prior art attempts have been made to utilize the eminently simple and inexpensive field effect transistor as a replacement for the vacuum tube pentode, and for other bulky and relatively expensive prior art devices. However, the characteristics of the prior art field effect transistor, including its relatively low output impedance, as compared with the plate resistance of the prior art pentode, have been limiting factors which have militated against the field effect transistor going into widespread use.

The usual prior art field effect transistor includes a first portion formed, for example, of n-type semiconductor material of high resistivity. This portion of the device is usually referred to as the "channel" and it has ohmic contacts at each end; these contacts being referred to as the "source" and "drain," respectively. The channel of the field effect transistor is surrounded by a second portion formed, for example, of p-type semiconductor material of low resistivity. This latter portion is usually referred to as the "gate," and it also has an ohmic contact so that a reverse bias may be introduced across the p-n junction between the two portions of the transistor.

Tetrode and pentode vacuum tubes each contain an element called a screed grid. Its function is to "screen" the anode from the control grid. The control grid senses the fixed positive voltage on the screen grid and does not sense changes in plate voltage. Consequently, output current from the tetrode and pentode vacuum tube is remarkably independent of plate voltage over a wide voltage range.

It is true that the ordinary field effect transistor exhibits nearly constant current in its output characteristics. Typical dynamic output resistance of a typical prior art transistor of this type, for example, is 40K ohms. But the screen electrode principle can increase this value easily by a factor of 100, with an attendant increase in voltage gain.

The principle is applied to the field effect transistor as follows: The drain of an ordinary field effect transistor can be employed as a "screen electrode." That is, by stabilizing drain voltage, the current through the transistor (for a given value of the gate voltage parameter) is naturally going to be a constant. This is accomplished in the assembly of the invention, in the embodiment to be described, by placing a variable resistance means in series with the transistor to take up voltage variations which would otherwise be imposed upon the drain. As a variable resistor a second field effect transistor is employed, for example, of somewhat higher pinch-off voltage and current than the primary device exhibits.

The two transistors are placed in series, as will be described. The primary transistor will be called the "lower"

and the auxiliary transistor will be called the "upper." The upper transistor is then used very effectively as a variable resistor by connecting its gate to the source of the lower device, thus biasing the gate of the upper by the entire voltage drop through the lower.

When the two transistors have been chosen properly, drain-source voltage on the lower transistor will be at some value which is above the knee of its characteristic curve under conditions such that the upper transistor is gate biased just enough to pull its current down to a first particular value. Now as drain voltage on the upper transistor is increased, current through the pair of transistors will increase very slowly, inasmuch as any increase in source-drain voltage on the lower transistor biases the upper transistor more heavily. When voltage on the upber reaches the breakdown value, drain-source voltage on the lower will have reached a second particular value displaced slightly from the first value. Therefore, current in the composite device changes only by an amount corresponding to the slight difference between the first and second particular values, when voltage applied to it is varied all the way from pinch-off to breakdown. Roughly speaking, the breakdown voltage of the composite assembly is the same as that of the upper transistor, whereas the transconductance of the composite assembly is the same as that of the lower transistor.

As the potential ($V_{DS}$) between the source and drain of the usual prior art field effect transistor is increased, the corresponding current ($I_D$) through the channel of the transistor increases. However, the resulting $I_D/V_{DS}$ curve tends to flatten out due to the saturating effect on the current ($I_D$) in the channel as the voltage between the drain and source ($V_{DS}$) reaches pinch-off voltage ($V_P$). A family of such curves may be obtained for different gate voltages which produce different reverse bias conditions across the p-n junction in the field effect transistor.

The resulting family of $I_D/V_{DS}$ characteristic curves for the prior art field effect transistor is similar to those of the vacuum tube pentode. This has caused the field effect transistor to be frequently compared with the vacuum tube pentode. However, although the prior art field effect transistor does have the important feature of high input impedance and relatively high output impedance, its output impedance is not comparable with the plate resistance of the vacuum tube pentode. The prior art field effect transistor, therefore, is incapable of exhibiting the extremely high amplification factor of the vacuum tube pentode.

In addition, it has been found that the saturated current ($I_P$) in the channel of the prior art field effect transistor has a tendency to increase with the voltage ($V_{DS}$) across the drain and source after pinch-off, so that the above-mentioned characteristic curves do not exhibit a true flattening after the pinch-off condition has been reached. This characteristic of the prior art field effect transistor has rendered such a device unsuited for precise and accurate current regulation purposes, and for other related applications.

The present invention provides a screen electrode type of transistor discharge device which is constructed to have an exceedingly high output impedance and, therefore, an improved amplification factor as compared with the prior art field effect transistor. This enables the field effect transistor of the invention to be used to advantage in amplifiers, and the like, so as to constitute a replacement for the more expensive prior art vacuum tubes, and for the more expensive type of transistors.

The improved screen electrode transistor of the invention is a relatively inexpensive device, and yet it exhibits all the favorable characteristics of the more expensive prior art pentode vacuum tubes, and of other types of solid state devices.

An object of the present invention, therefore, is to provide a screen electrode transistor assembly which exhibits a markedly increased output impedance as compared with the usual prior art field effect transistor, so as to provide a markedly increased amplification factor.

A more general object of the invention is to provide a screen electrode transistor assembly which is relatively inexpensive to construct, and which exhibits all the favorable characteristics of the more expensive prior art vacuum tubes and other types of transistors.

The usual prior art field effect transistor has a serious frequency limitation because of the relatively high Miller capacitance inherent in its geometry. However, if the geometry of the prior art field effect transistor is altered to reduce the Miller effect, the resulting decrease in transconductance ($g_m$) without a concomitant increase in output impedance, causes the theoretically maximum achievable gain of the device to decrease.

The screen electrode transistor assembly of the present invention, with its radically increased output impedance, overcomes the problem outlined immediately above. In a unit constructed in accordance with the invention, the geometry can be such that Miller effect is reduced and yet provide for adequate achievable gain. It follows, therefore, that the transistor of the invention can be constructed to operate with improved efficiency for the amplification of signals extending through a relatively wide frequency range.

Another object of the invention, therefore, is to provide a screen electrode transistor assembly which does not exhibit the frequency limitations of the usual prior art field effect transistors.

A feature of the invention is the provision of a screen electrode transistor assembly which is constructed to incorporate a pair of field effect transistors effectively connected to provide a strong internal feed-back so as to provide the desired high output impedance of the assembly.

The resulting screen electrode transistor assembly of the invention has a $I_D/V_{DS}$ characteristic that rises to a saturation point and then assumes an extremely flat, constant $I_D$ configuration as the saturation point is exceeded. This enables the screen electrode transistor of the invention to be used satisfactorily for current regulation purposes, and for related applications.

It is, accordingly, another object of the invention to provide an improved discharge device of the field effect transistor type which is capable of providing an inexpensive means for current regulation having characteristics superior to those of the prior art devices, such as the vacuum tube pentodes, or the like.

Other objects and advantages of the invention will become apparent upon a consideration of the following discussion and descriptive material, when the material is taken in conjunction with the accompanying drawings, in which:

FIGURE 1 is a schematic representation of a usual field effect transistor, this representation being convenient in the explanation of the functioning of the improved assembly of the present invention;

FIGURES 2*a*, 2*b* and 2*c* are certain field effect transistor characteristic curves including curves representative of the characteristic of the improved field effect transistor of the invention;

Before describing the improved screen electrode transistor assembly of the invention, the following mathematical description of the prior art field effect transistor is believed to be of assistance in understanding the concepts of the present invention.

The basic relation describing the behavior of the field effect transistor may be expressed in the following equation:

$$I_D=1/R_o\left\{(V_D-V_G)\left[1-\tfrac{2}{3}\frac{V_D-V_G}{(P)^{1/2}}\right]-(V_S-V_G)\left[1-\tfrac{2}{3}\frac{V_S-V_G}{(P)^{1/2}}\right]\right\} \quad (1)$$

In Equation 1, $R_o$ represents the resistance of the channel, $V_D$ the drain voltage, $V_G$ the gate voltage, and $V_S$ the source voltage. Equation 1 is valid up to the pinch-off condition. Beyond the pinch-off condition, it has been generally assumed in the prior art that the drain current $I_D$ is constant.

Figure 1:
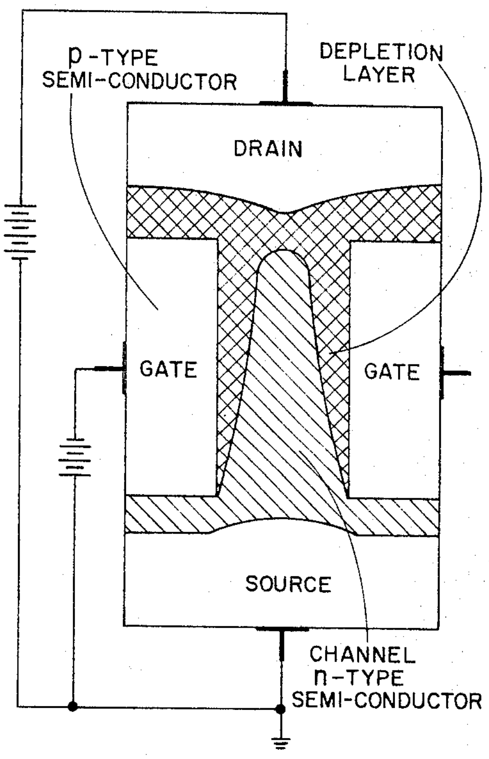

The diagrammatic representation of FIGURE 1 illustrates the action within the prior art field effect transistor, and the assumed conditions within the transistor after the pinch-off condition has been reached. The illustrated transistor of FIGURE 1 is shown as having a drain and a source. The source is grounded, and a battery 10 applies a positive potential ($V_{DS}$) across the drain and the source. A further battery 12 introduces a reverse bias to the gate of the transistor.

When the gate is reverse-biased relative to the channel as shown in FIGURE 1, and the bias voltage is low; the junction depletion layer, illustrated by the double cross-hatched area in FIGURE 1, is relatively thin. Under these conditions, a large current can flow through the channel of the transistor of FIGURE 1 from the source to the drain. However, when the reverse gate bias is increased, the depletion layer grows until it assumes the illustrated condition in FIGURE 1 at the pinch-off condition.

The above Equation 1 is the general case. In actual operation, either one of the three contacts, the drain, the source, or the gate, is used as common, and the proper situation may be easily derived from Equation 1 (that is, $V_S=0$, $V_G=0$, and $V_D=0$). For the present, the general case will be discussed, and Equation 1 will be rewritten in the following form:

$$I_D=\frac{V_P}{R_o}\left\{\frac{V_D}{V_P}-\tfrac{2}{3}\left[\left(\frac{V_D-V_G}{V_P}\right)^{3/2}+\left(\frac{V_S-V_G}{V_P}\right)^{3/2}\right]-\frac{V_S}{V_P}\right\} \quad (2)$$

At the outset, the locus of the pinch-off voltage under different $V_G$ biasing conditions will be determined. It is pointed out that if the theoretical description of the prior art is regarded as valid, in order that the theoretical curves should be continuous, Equation 2 must have a maximum if pinch-off occurs, since beyond pinch-off $I_D$ is considered to be constant.

If the following three variables are introduced:

$$X=V_D/V_P \quad (3a)$$
$$Y=-V_G/V_P \quad (3b)$$
$$Z=V_S/V_P \quad (3c)$$

then Equation 2 can be rewritten as:

$$I_D(X,Y,Z)=V_P/R_0\{X-\tfrac{2}{3}[(X+Y)^{3/2}+(Z+Y)^{3/2}]-Z\} \quad (4)$$

This being a four dimensional problem, the full derivative of Equation 4 will result in three dimensional pinch-off surfaces where:

$$\frac{\partial I_D}{\partial \tau}=0 \qquad (5)$$

It turns out that if $Y$=constant parameter, $Z=0$, the locus of the pinch-off voltage can be described as:

$$V_D-V_G=V_P \qquad (6)$$

If $Y=0$, and $Z$=constant, then:

$$V_D=V_P \text{ etc.} \qquad (7)$$

To maintain the constancy of the current beyond pinch-off, one has to suppose a finite resistivity of the depletion layer, which obviously is much higher than the one represented by the material of the channel. Furthermore, to maintain the same configuration of the shape of the depletion layer of the channel, one must suppose the same voltage drop ($V_P$) and similar distribution of the potential in the channel region as in the pinch-off condition.

To have constant current, the following condition must hold:

$$\frac{V_D-V_P}{R_{DEPL}}=\text{Constant} \qquad (8)$$

However, this is not so, and therefore, the current $I_D$ increases in the usual prior art field effect transistor after pinch-off. As it can be seen, the problem of obtaining high output impedances is rather limited with a single unit because of the involved parameters. Another manner of achieving the desired output impedance would be to use internal feed-back, and this is achieved in the assembly of the invention is a manner to be described.

Figure 3:
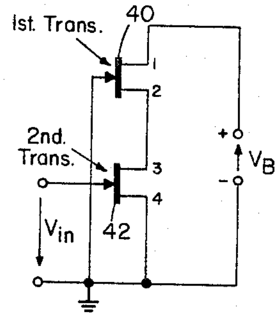
FIGURE 3 is the circuit equivalent of a screen electrode transistor assembly constructed in accordance with a first embodiment of the invention.

The circuit of FIGURE 3 includes a pair of field effect transistors designated 40 and 42. The source of the upper transistor 40 is connected to the drain of the lower transistor 42, and the source of the lower transistor is grounded. The drain of the upper transistor 40 is connected to the positive terminal of the drain-source voltage source, such as the battery 10 in FIGURE 1, designated $V_B$ in FIGURE 3. The gate of the upper field effect transistor 40 in FIGURE 3 is connected to a more negative point than $V_D$ of the lower transistor 42, that is, to ground, as in the source of the lower field effect transistor 42. The input signal $V_{in}$ is applied between the gate of the lower transistor 42 and ground.

Figure 2A:
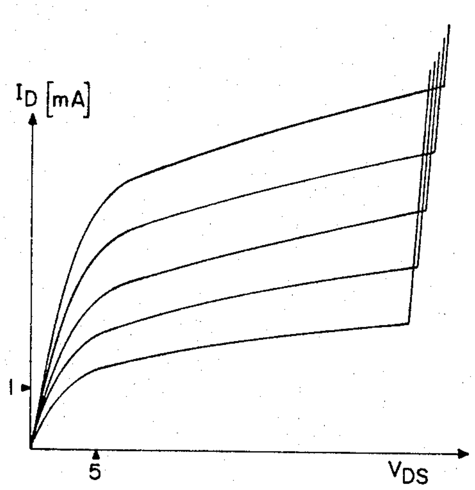
Figure 2B:
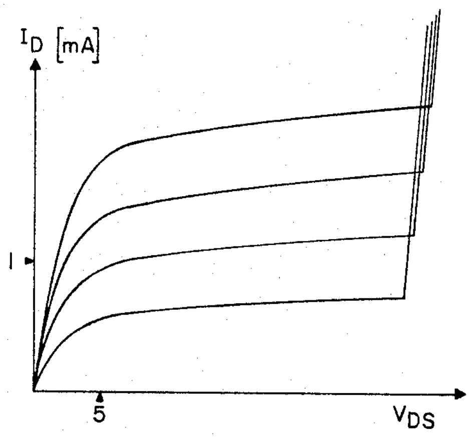

The field effect transistors 40 and 42 may have individual characteristics similar to the prior art field effect transistors (FIGURES 2*a*, 2*b*). The same limitations are applied to the potential of the input $V_{in}$ as in the case with the usual prior art field effect transistors. It is also required that the pinch-off current $I_P$ of the field effect transistor 40 be equal to or greater than the pinch-off current for the field effect transistor 42, for equivalent gate bias conditions.

Figure 2C:
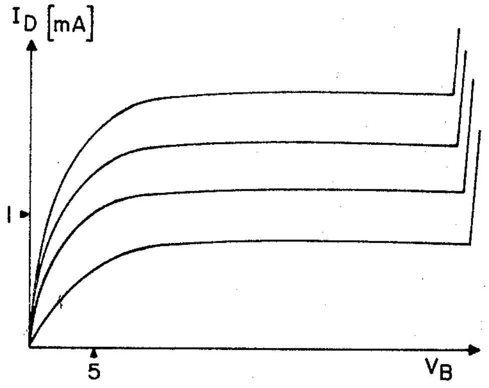

If the connections shown in FIGURE 3 are made, an interaction between the transistors 40 and 42 takes place beyond the pinch-off region of the composite assembly, and as a result of this interaction, an extremely constant drain current beyond pinch-off ($I_P$) is the result (FIGURE 2*c*). The reaction between the transistors 40 and 42 can be described in the following manner.

As mentioned above, the two field effect transistors 40 and 42 are selected so that under the same bias conditions, the pinch-off ($I_P$) current of the transistor 40 is higher than the pinch-off ($I_P$) of the transistor 42.

When the transistors 40 and 42 are connected in the manner shown in FIGURE 3, a certain current ($I_D$) passes through the two transistors below the pinch-off condition. If then, the $V_{DS}$ voltage ($V_B$) is raised to a point that the transistor 42 is driven to its pinch-off condition, the transistor 40 will still be below its pinch-off condition. Under these circumstances, almost all the $V_B$ voltage is consumed by the transistor 42. This is because:

$$I_P(40)>I_P(42)$$
$$V_P(40)\geqslant V_P(42) \qquad (9)$$

The above described conditions occur in the two field effect transistors 40 and 42 because when the drain voltage ($V_B$) is increased, the drain current increases, but at the same time, the depletion between the drain and the gate of each transistor grows, constricting the drain end of each channel. Further increase of drain voltage $V_B$ results in less and less current increase through the two transistors 40 and 42 until a current saturation value is reached when the sum of the gate and drain voltages is equal to the pinch-off voltage.

The pinch-off voltage for the transistor 42 is determined by Equation 6, and the pinch-off voltage for the transistor 40 is determined by the Equation 7. Then, if $V_B$ reaches the value of $V_P(40)$, the transistor 40 will enter the pinch-off condition also, and the interaction will begin. If the voltage $V_B$ is further raised, then, because of the non-ideal characteristics of the field effect transistor 40, the drain current $I_D$ also tends to increase.

However, because of the series connection of the transistors 40 and 42, the above-mentioned increase in drain current through the transistor 40 also requires that the drain current through the transistor 42 increases. This would require that the voltage across the transistor 42 must increase. However, if the voltage across the transistor 42 increases, this means that the transistor 40 will be more biased and its current handling capabilities would decrease. This interaction results in an extremely flat $I_D/V_{DS}$ characteristic curve (FIGURE 2*c*) from pinch-off until breakdown occurs.

The composite transistor assembly represented by the circuit of FIGURE 3 is most advantageous in that it exhibits the desired high output impedance. This characteristic, in addition to the extremely flat $I_D/V_{DS}$ curves, renders the device functionally comparable with the vacuum tube pentode, and, in many respects, superior to the pentode.

An advantage of the composite transistor assembly of the present invention over the usual prior art field effect transistors, is that the relatively high Miller capacitance inherent in the geometry of the prior art field effect transistor can be reduced in the assembly of the invention.

As mentioned above, the value of the Miller capacitance may be reduced in the usual field effect transistor by reducing the dimensions of the device. However, as noted, such a reduction in the prior art device decreases its transconductance ($g_m$), and does not increase its output impedance ($\gamma_P$) appreciably. Therefore, the theoretically achievable maximum gain ($\mu=g_m\gamma_P$) of the prior art field effect transistor will decrease as the geometry of the device is reduced.

This problem of decreased gain in the prior art device can be overcome in the transistor assembly of the present invention, since the assembly of the invention is constructed radically to increase the output impedance ($r_P$). This means that the practically achievable gain of the composite transistor assembly of the present invention is higher than the theoretical maximum of the prior art field effect transistor.

Figure 4:
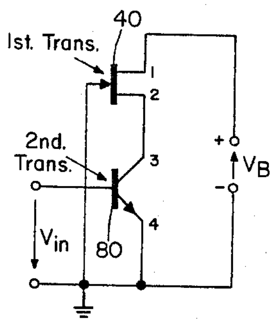
FIGURE 4 is the circuit equivalent of a screen electrode transistor assembly constructed in accordance with a second embodiment of the invention.

As will be described, the same composite effect as is achieved by the field effect transistors 40 and 42 in FIGURE 3 can be achieved by replacing the field effect transistor 42 by a junction transistor 80 (FIGURE 4). In the latter instance, however, the collector current of the junction transistor ($\beta I_B$) should be less than the pinch-off current ($I_{P40}$) of the field effect transistor 40, since otherwise one would not obtain the previously described feedback interaction.

A family of $I_D/V_{DS}$ characteristic curves for the transistor 40 for different gate bias voltages is illustrated in FIGURE 2*a*; and a family of $I_D/V_{DS}$ characteristic curves for the transistor 42 for different gate bias voltages is illustrated in FIG. 2*b*. The curves of FIGURE 2*c* are characteristic $I_D/V_{DS}$ curves for the composite transistor assembly of the present invention, as functionally represented by the interconnected field effect transistors 40 and 42 in FIGURE 2.

As mentioned above, and as shown in FIGURES 2*a* and 2*b*, when the drain voltage $V_{DS}$ across a unipolar field effect transistor is increased, the drain current ($I_D$) increases, but at the same time the depletion layer between the drain and the gate grows, constructing the drain end of the channel (FIGURE 1). Therefore, as shown by the curves of FIGURES 2*a*, 2*b* and 2*c*, further increase of the drain voltage ($V_{DS}$) results in less and less current increase until a current saturation value is reached. This occurs when the sum of the gate and drain voltages is equal to the pinch-off voltage. Then at higher drain voltages, the drain current remains nearly constant until breakdown of the device.

The screen electrode transistor of the invention has considerably flatter $I_D/V_{DS}$ characteristics than the prior art field effect transistors, as shown by the curve of FIGURE 2*c*. This renders the device of the invention ideal for current regulation purposes, and for related applications, as mentioned above.

The family of curves shown in FIGURE 2*a* may be considered to represent the $I_D/V_{DS}$ characteristics of the field effect transistor for different values of the input $V_{in}$. Likewise, the family of curves shown in FIGURE 2*b* may be considered to represent the $I_D/V_{DS}$ characteristics of the field effect transistor 42 for different values of the input signal $V_{in}$.

In explaining the operation of the screen electrode transistor of the invention, it may be assumed that the input signal $V_{in}$ is held constant and that the value of the potential source $V_B$ is increased to increase the potential $V_{DS}$. In the first part of the characteristic curves of FIGURE 2*c*, the drain current ($I_D$) will increase until the pinch-off condition of the field effect transistor 42 is reached. At this point, the value of the potential $V_B$ will be slightly higher than the pinch-off voltage across the field effect transistor 42, this being because of the voltage drop across the field effect transistor 40.

Now, and as described above, if the potential value of the source $V_B$ is further increased, the saturated drain current ($I_P$) cannot increase appreciably since the field effect transistor 42 is in its pinch-off condition and the voltage across the field effect transistor 42 will hold at the required bias enabling the field effect transistor 40 to pass only that amount of current.

The above described interaction between the field effect transistors 40 and 42 results in the extremely flat $I_D/V_{DS}$ characteristic curves shown in FIGURE 2*c*. The flat portion of each of the curves of FIGURE 2*c* continues with increase in the voltage $V_{DS}$ until breakdown of the composite transistor assembly occurs.

Figure 5:
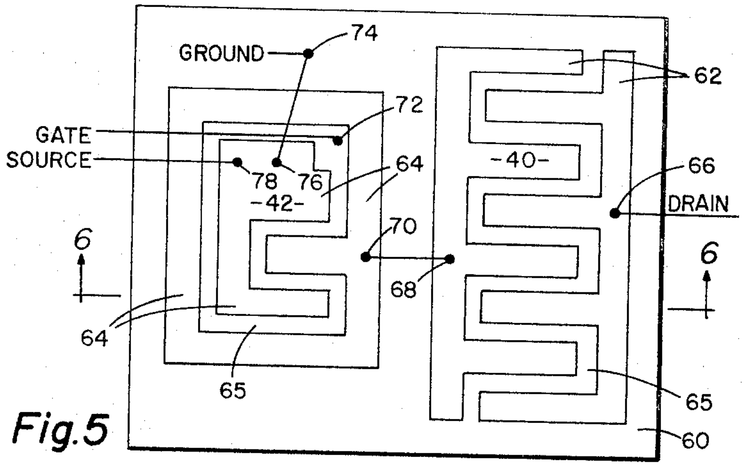
FIGURE 5 is a top plan view of a transistor assembly constructed in accordance with the first embodiment of the invention as represented in FIGURE 3.
Figure 6:
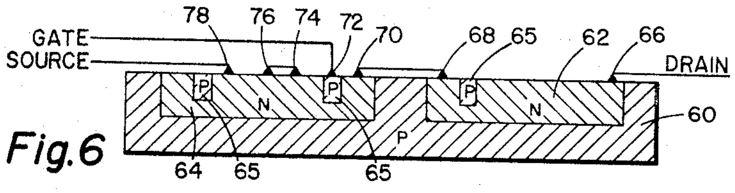
FIGURE 6 is a sectional view of the transistor assembly of FIGURE 5, taken substantially on the line 6—6 of FIGURE 5.

The screen electrode transistor of the invention corresponding to the embodiment represented schematically in FIGURE 3 can be constructed in the integrated manner in a side-by-side relationship of the transistors 40 and 42, as shown in FIGURES 5 and 6. Alternately, and if so desired, a simple concentric integrated construction for the different fused junctions of the transistors 40 and 42 on a particular substrate can be used.

The left-hand portion of the integrated transistor of FIGURES 5 and 6 corresponds to the field effect transistor 42 in FIGURE 3, and the right-hand portion is representative of the field effect transistor 40.

The integrated screen electrode transistor of FIGURES 5 and 6 includes a chip or substrate 60, a relatively low resistivity p-type semiconductor material. A first region 62 of relatively high resistivity n-type material is diffused into the substrate 60, in the configuration of FIGURE 5, to form the p-n junctions of the transistor 40. A second region 64 of relatively high resistivity n-type material, having the configuration shown in FIGURE 5 is diffused into the substrate 60. The p-type gate regions 65 are then formed in a subsequent diffusion step.

An ohmic contact 66 is affixed to the region 62 at one side thereof to constitute the drain for the screen electrode transistor. A second ohmic contact 68 is attached to the region 62 at the opposite side thereof, and this latter contact constitutes the source of the field effect transistor 40. The contact 68 is connected to an ohmic contact 70 on the region 64, the latter contact constituting the drain for the field effect transistor 42. An ohmic contact 72 is affixed on the gate region of the transistor assembly.

An ohmic contact 74 is formed on the substrate 60 as a ground contact, and it is connected to an ohmic contact 76 formed on the central part of the region 64. An ohmic contact 78, constituting the source for the composite transistor is also affixed to the central part of the region 64.

The transistor of FIGURES 5 and 6 is a three element device, and it operates in the manner described above, in conjunction with FIGURE 3, to constitute a composite integrated field effect transistor exhibiting the desired characteristics of FIGURE 2*c*. The integrated transistor of FIGURE 3 exhibits a relatively high output impedance, so that it may be considered the true functional equivalent of the vacuum tube pentode.

In the representation of FIGURE 4, the field effect transistor 42 is replaced by a junction of type NPN transistor 80. The connections in the diagram of FIGURE 4 are the same as those of FIGURE 3. The basic operating principle of the circuit of FIGURE 4 is the same as described above in conjunction with FIGURE 3. The limitation in the latter circuit is that the collector current ($\beta I_B$) of the transistor 80 is either smaller or equal to the pinch-off current ($I_P$) of the field effect transistor 40, under equivalent gate and base biased conditions.

The collector current of the transistor 80 in the circuit of FIGURE 4 cannot exceed the current through the field effect transistor 40. Therefore, the characteristics of the circuit of FIGURE 4 are similar to the characteristics of the circuit of FIGURE 3, and for the reasons described above.

Figure 7:
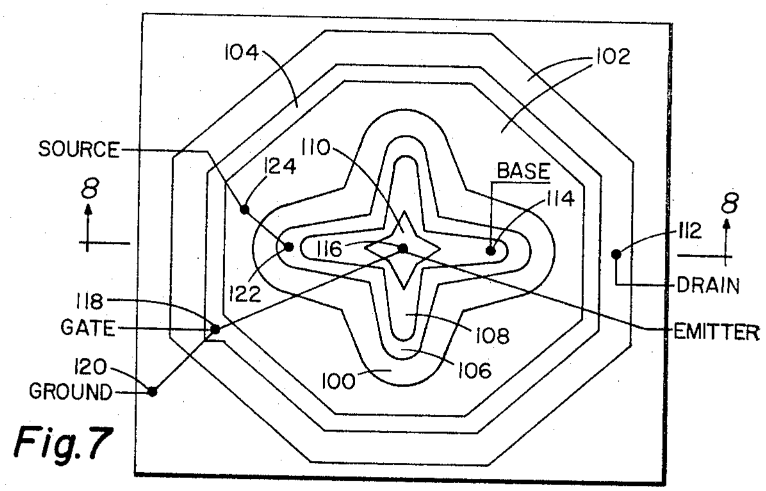
FIGURE 7 is a top plan view of a transistor assembly constructed in accordance with a second embodiment of the invention as represented in FIGURE 3.
Figure 8:
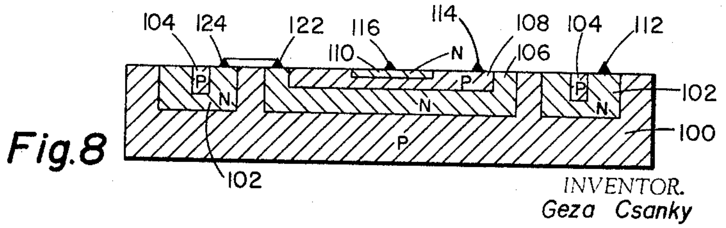
FIGURE 8 is a sectional view of the assembly of FIGURE 7, taken substantially on the line 8—8 of FIGURE 7.

The circuit of FIGURE 4 can be embodied into a single integrated transistor assembly, as shown in FIGURES 7 and 8. The integrated transistor of FIGURES 7 and 8 is formed on a substrate 100 of relatively low resistivity p-type semiconductor material. An n-type diffused region 102 is formed in the substrate 100 and, in a constructed embodiment, this region has an octagonal configuration, as shown in FIGURE 7.

A p-type region 104 is formed in the octagonal n-type region 102, and, as shown in FIGURE 7, the p-type region 104 extends around an octagonal path parallel to the side of the n-type region 102. The p-type substrate 100 extends up through the n-type region 102 in a star-like configuration, as shown in FIGURE 7, to be enclosed by the n-type region 102.

A further n-type region 106, having a configuration similar to the star-like portion of the substrate 100, is formed within the aforementioned portion, as also shown in FIGURE 7. A further p-type portion 108 is formed within the n-type region 106, and a further n-type region 110, also having a star-like configuration is formed within the region 108.

An ohmic contact 112 affixed to the n-type region 102 forms the drain for the screen electrode transistor, and an ohmic contact 114 affixed to the region 108 forms the base.

An electrode 116 formed on the region 110 constitutes the emitter electrode of the transistor, and the emitter is connected to a contact 118 on the region 104, the latter constituting the gate of the field effect transistor 40. The contact 118 is also connected to a ground contact 120 formed on the substrate 102.

A collector electrode 122 is formed on the region 106, and this electrode is connected to a contact 124 on the region 102. The contact 124 forms the source for the transistor 40.

The invention provides therefore, a screen electrode effect transistor assembly which is particularly suited for integrated circuit construction, as described above.

The improved transistor assembly of the present invention is advantageous in that it exhibits favorable characteristics so as to enable it to be used in amplifiers, current regulators, and the like, in place of the more expensive types of transistors and vacuum tube devices.

Specifically, the screen electrode transistor assembly of the present invention represents an inexpensive solid state transistor which exhibits an output impedance corresponding to the output impedance of the vacuum tube pentode, so that comparable gains may be achieved.

Moreover, the improved transistor of the invention exhibits favorable characteristics, as described above, which renders it ideally suited for current regulation purposes, and for related applications.

In addition, the improved transistor assembly of the invention does not exhibit the frequency limitations of the prior art transistors of the same general type, and is therefore particularly suited for use in amplifying signals extending throughout extremely wide frequency ranges.

While particular embodiments of the invention have been shown and described, modifications may be made, and it is intended in the claims to cover such modifications which fall within the scope of the invention.

What is claimed is:

1. Transistor means including in combination: a first transistor having a first region and a second region, first and second electrode means coupled to said first region for producing a current flow therethrough, and a first control electrode means coupled to said second region for controlling the current flow through said first region; a second transistor having a first region and a second region, third and fourth electrode means coupled to said first region of said second transistor for producing a current flow therethrough, and a second control electrode means coupled to said second region of said second transistor for controlling the current flow through said first region, said second transistor having a lower pinch-off current point than said first transistor; means connecting said second electrode means to said third electrode means to place said first regions of said first and second transistor means in series; means connecting said first control electrode means to said fourth electrode means; means for introducing a unidirectional potential between said first and fourth electrode means; and means for introducing an input signal between said second control electrode means and said fourth electrode means.

2. Transistor means including in combination: a first field effect transistor having a first region and a second region, first and second contact means affixed to said first region for producing a current flow therethrough, a first gate contact means affixed to said second region for controlling the current flow through said first region; a second field effect transistor having a first region and a second region, third and fourth contact means affixed to said first region of said second transistor for producing a current flow therethrough, and a second gate contact means affixed to said second region of said second transistor for controlling the current flow through said first region thereof, said second field effect transistor having a lower pinch-off current point than said first transistor; means connecting said second contact means to said third contact means to place said first regions of said first and second transistors in series; means connecting said first gate contact means to said fourth contact means; means for introducing a unidirectional exciting potential across said first and fourth contact means; and means for introducing an input signal between said second gate contact means and said fourth contact means.

3. Transistor means including in combination: a field effect transistor having a first region and a second region, first and second contact means coupled to said first region for producing a current flow therethrough, and a first gate contact means coupled to said second region for controlling the current flow through said first region; a junction transistor having a collector electrode, an emitter electrode, and a base electrode said junction transistor having a lower saturation point than the pinch-off current point of said field effect transistor; means connecting said collector electrode to said second contact means to connect said field effect transistor and said said junction transistor in series; means for connecting said gate contact means to said emitter electrode; means for introducing an input signal between said base electrode and said emitter electrode; and means for applying a unidirectional exciting potential between said second contact means and said emitter electrode.

4. Transistor means including in combination: a first field effect transistor having a channel region and a gate region, first drain and source contact means affixed to said channel region for producing a current flow therethrough and first gate contact means affixed to said gate region for controlling the current flow through said channel; a second field effect transistor having a channel region and a gate region, second drain and source contact means affixed to said channel region of said second transistor for producing a current flow therethrough, and a second gate contact means affixed to said gate region of said second transistor for controlling the current flow through said channel region thereof, said second field effect transistor having a lower pinch-off current point than said first field effect transistor; means connecting said second drain contact means to said first source contact means to place said channel regions of said first and second transistors in series; means connecting said first gate contact means and said second source contact means to a point of reference potential; means for introducing a unidirectional exciting potential across said first drain contact means and said point of reference potential; and means for introducing an input signal between said second gate contact means and said second source contact means.

5. An integrated transistor assembly including in combination: a substrate of semiconductor material having a first region and a second region of one conductivity type and a third region and a fourth region of the opposite conductivity type adjoining each of said first and second regions respectively and forming a p-n junction therewith; first and second electrode means affixed to said first region for producing a current flow therethrough, and first control electrode means affixed to said third region for controlling the current flow through said first region; third and fourth electrode means affixed to said second region for producing a current flow therethrough, and a second control electrode means coupled to said fourth region for controlling said current flow through said second region, said first and third regions having a higher pinch-off current point than said second and fourth regions; means connecting said second electrode means to said third electrode means to connect said first and second regions of said semiconductor means in series; and means connecting said first control electrode means to a potential point below the potential of said second electrode means, means for introducing a unidirectional exciting potential across said first and fourth electrode means; and means for introducing an input signal between said second control electrode means and said fourth electrode means.

6. An integrated transistor assembly including in combination: a substrate of semiconductor material having at least a first region, a second region, a third region, and a fourth region, said first and second regions being of opposite conductivity types and being adjacent one another to form a first p-n junction therebetween, said third and fourth regions being of opposite conductivity types and being adjacent one another to form a p-n junction therebetween; first and second electrode means coupled to said first region for producing a current flow through said first region, and a first control electrode means coupled to said second region for controlling said current flow through said first region; third and fourth electrode means coupled to said third region for producing a current flow through said third region, and a second control electrode means coupled to said fourth region for controlling said current flow through said third region, said first and second regions having a higher pinch-off current point than said third and fourth regions; means connecting said second electrode means to said third electrode means to connect said first and third regions in series; and means connecting said first control electrode means to said fourth electrode means.

References Cited by the Examiner

UNITED STATES PATENTS

| | | | |
|---|---|---|---|
| 3,070,762 | 11/1962 | Evans | 333—70 |
| 3,105,196 | 9/1963 | Lerner | 328—91 |
| 3,130,377 | 4/1964 | Brown | 331—108 |
| 3,135,926 | 6/1964 | Brockermuehl | 330—38 |

JOHN W. HUCKERT, *Primary Examiner.*

M. EDLOW, *Assistant Examiner.*